United States Patent [19]
Tanaka et al.

[11] Patent Number: 4,884,090
[45] Date of Patent: Nov. 28, 1989

[54] PIEZOELECTRIC ACTUATING DEVICE

[75] Inventors: Yoshihiro Tanaka; Hiroshi Ootsuka; Koh Hayama, all of Osaka, Japan

[73] Assignee: Minolta Camera Kabushiki Kaisha, Osaka, Japan

[21] Appl. No.: 327,393

[22] Filed: Mar. 22, 1989

Related U.S. Application Data

[63] Continuation of Ser. No. 172,599, Mar. 24, 1988, abandoned.

[30] Foreign Application Priority Data

Mar. 25, 1987 [JP] Japan ................................. 62-72751

[51] Int. Cl.⁴ ....................... G03B 7/08; H01L 41/08
[52] U.S. Cl. ........................... 354/234.1; 310/332; 354/457
[58] Field of Search ................. 354/457, 234.1; 310/332

[56] References Cited

U.S. PATENT DOCUMENTS

| | | | |
|---|---|---|---|
| 4,234,245 | 11/1980 | Toda et al. | 354/234.1 X |
| 4,349,762 | 9/1982 | Kitamura et al. | 310/332 |
| 4,609,275 | 9/1986 | Ishiguro | 354/435 |
| 4,786,930 | 11/1988 | Suzuki et al. | 354/234.1 |
| 4,791,442 | 12/1988 | Touma et al. | 354/234.1 |

FOREIGN PATENT DOCUMENTS

| | | |
|---|---|---|
| 51-36155 | 10/1976 | Japan . |
| 59-31078 | 2/1984 | Japan . |
| 59-32183 | 2/1984 | Japan . |
| 59-63782 | 4/1984 | Japan . |
| 59-63783 | 4/1984 | Japan . |
| 61-295535 | 12/1986 | Japan . |

Primary Examiner—Michael L. Gellner
Attorney, Agent, or Firm—Burns, Doane, Swecker & Mathis

[57] ABSTRACT

A piezo-electric actuating device employing a piezoelectric element as an actuating member wherein a sufficient amount of movement of a driven member such as a shutter of a camera can be assured. The piezo-electric element of the device includes a first piezo-electric member which is contracted when a first voltage of a first polarity is applied thereacross and which is elongated when a second voltage of a second polarity opposite to the first polarity is applied thereacross, and a second piezo-electric member which is contracted when the second voltage is applied thereacross and which is elongated when the first voltage is applied thereacross. The piezo-electric member is deformed to move a driven member in one or the other when the first or second voltage is applied thereto, and the first and second piezo-electric members have a higher yield strength against deformation thereof by application of the first voltage than by application of the second voltage.

3 Claims, 8 Drawing Sheets

PIEZOELECTRIC ACTUATING DEVICE

This application is a continuation of application Ser. No. 172,599, filed Mar. 24, 1988, abandoned.

BACKGROUND OF THE INVENTION

1. Field of the Invention

This invention relates to an actuating device using a piezo-electric element for actuating a driven member such as a shutter blade of a camera.

2. Description of the Prior Art

An actuating mechanism wherein a piezo-electric element is used for opening and closing the shutter of a camera is already known and disclosed, for example, in Japanese Patent Laid-Open No. 61-83523.

Where a piezo-electric element is used for actuation of the shutter of a camera, it is desirable to employ, as a material of the piezo-electric element, piezo-electric ceramics having a possible maximum deformability or deforming force in order to assure a sufficient magnitude of a shutter opening.

By the way, a piezo-electric ceramics material is deformed (elongated or contracted) in one direction when a voltage having a certain polarity with respect to the direction of polarization thereof is applied thereto, but deformed in the reverse direction when a voltage having the opposite polarity is applied thereto. Such a piezo-electric ceramics material normally has a characteristic that it has such a sufficient physical yield strength against deformation thereof by application of a voltage of one polarity that it can be deformed until such a high voltage as to cause a dielectric breakdown is applied but the yield strength thereof against deformation thereof by application of a voltage of the opposite polarity is so low that it may be broken by application of a voltage only as high as one tenth or so of the voltage at which a dielectric breakdown occurs.

Particularly, a piezo-electric ceramics material has a characteristic that where it has a high yield strength against deformation thereof and can thus be deformed by a great amount by application of a voltage of one polarity, it generally has a lower yield strength against deformation thereof by application of a voltage of the other polarity.

In the case of a piezo-electric element formed from two piezo-electric ceramics members in the form of sheets or plates applied to each other with an electrode plate interposed therebetween, a voltage is applied between the electrode plate and the opposite faces of the two piezo-electric ceramics members remote from the electrode plate. Thus, if a voltage is applied to the piezo-electric element, the voltages are applied in the opposite polarities across the two piezo-electric ceramics members.

When the piezo-electric element is to be bent or deformed laterally in one direction, a voltage is applied across one of the piezo-electric ceramics members in such a direction or polarity that the one piezo-electric ceramics member is contracted while a voltage is applied across the other piezo-electric ceramics member in such a direction or polarity that the latter is elongated. In this instance, if it is assumed that the one piezo-electric ceramics member has a sufficient yield strength against deformation thereof by application thereto of a voltage in the direction for contraction thereof, it can be deformed by a great amount but the other piezo-electric ceramics member cannot be deformed by a sufficient amount because the yield strength thereof in the direction is low. On the contrary, if the respective reverse voltages are applied to the one and the other piezo-electric ceramics members, the one piezo-electric ceramics member cannot be deformed by a sufficient amount.

Accordingly, where a mechanism of the camera for opening and closing the shutter employs a piezo-electric element, it has a drawback that a sufficient amount of deformation of the piezo-electric element cannot be assured because, while piezo-electric ceramics members included in the piezo-electric element have a sufficient yield strength against deformation thereof in respective predetermined directions, it is possible to apply only such a low voltage to the piezo-electric element which can provide a small amount of deformation of the piezo-electric members in the respective opposite directions.

Accordingly, a shutter actuating device in which a piezo-electric element is employed is disadvantageous in that a sufficiently great amount of shutter opening cannot be assured.

SUMMARY OF THE INVENTION

It is an object of the present invention to provide a piezo-electric actuating device employing a piezo-electric element as an actuating member wherein a sufficient amount of movement of a driven member such as a shutter of a camera can be assured.

In order to attain the object, according to the present invention, there is provided a piezo-electric actuating device which is applied a first voltage of a first polarity and a second voltage of a second polarity and opposite to the first polarity and comprises a piezo-electric element including a first piezo-electric member which is contracted when the first voltage is applied thereacross and which is elongated when a second voltage is applied thereacross, the piezo-electric element further including a second piezo-electric member which is contracted when the second voltage is applied thereacross and which is elongated when the first voltage is applied thereacross, the piezo-electric member being deformed by application of the first or second voltage thereto, a voltage applying means for alternatively applying the first and second voltages to the piezo-electric element, and a driven member connected to be actuated by the piezo-electric element upon deformation of the piezo-electric element such that when the first voltage is applied to the piezo-electric element, the driven member is moved in a first direction, and when the second voltage is applied to the piezo-electric element, the driven member is moved in a second direction opposite to the first direction, the first and second piezo-electric members having a higher yield strength against deformation thereof by application of the first voltage than by application of the second voltage.

With the piezo-electric actuating device, the first and second piezo-electric members of the piezo-electric element have a high yield strength against deformation thereof by application of the first voltage than by application of the second voltage. Thus, when the first voltage is applied to the piezo-electric element, the first and second piezo-electric members are deformed by a great amount to move the driven member by a great amount for its initial position. Then, when the second voltage is applied to the piezo-electric element, the first and second piezo-electric members are deformed to move the driven member back to its initial position.

Thus, the piezo-electric element of the piezo-electric actuating device exerts a great deforming force and has a high yield strength against deformation thereof by application of the first voltage to move the driven member in the forward direction from its initial position. Accordingly, the driven member can be moved by a sufficient amount in the forward direction by the piezo-electric element. Therefore, where the piezo-electric actuating device is applied to a shutter actuating device of a camera, a sufficient amount of shutter opening can be assured.

The above and other objects, features and advantages of the present invention will become apparent from the following description and the appended claims, taken in conjunction with the accompanying drawings.

DETAILED DESCRIPTION OF THE PREFERRED EMBODIMENTS

Figure 10:
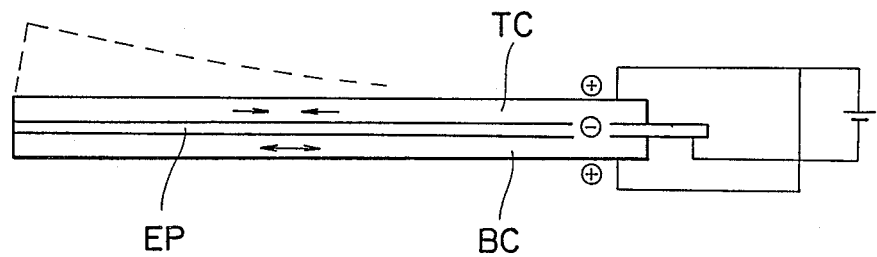
FIG. 10 is a diagrammatic representation illustrating a common piezo-electric element.

Referring first to FIG. 10, a conventionally piezo-electric element and a manner of application of a voltage are shown in diagrammatic representation. The piezo-electric element includes a flexible electrode plate EP and two upper and lower piezo-electric ceramics members or plates TC and BC applied to the opposite faces of the electrode plate EP. If a voltage is applied across the upper piezo-electric ceramics member TC is such a direction or polarity as to contract the piezo-electric ceramics member TC while a voltage is applied across the other piezo-electric ceramics member BC is such a direction or polarity as to elongate the piezo-electric ceramics member BC, the piezo-electric element is bent or deformed laterally in an upward direction from the position indicated in full lines in FIG. 10 to the position indicated in broken lines in FIG. 10. Therefore, as described hereinabove, if the upper piezo-electric ceramics member TC has a sufficient yield strength against deformation thereof by application thereto of a voltage in the direction for contraction thereof, it can be deformed by a great amount but the other piezo-electric ceramics member BC cannot be deformed by a sufficient amount because the yield strength thereof in the direction is low. On the contrary, if the respective reverse voltages are applied to the two piezo-electric ceramics members TC and BC, the upper piezo-electric ceramics members TC cannot be deformed by a sufficient amount.

Referring now to FIGS. 1 to 4, there is shown a piezo-electric shutter actuating device to which the present invention is applied. The shutter actuating device is generally constituted such that a pair of shutter blades 2 and 4 are pivoted at the same time in the mutually opposite directions by a driving force produced by a piezo-electric element 14 having one end secured to a base plate 6 by a holding plate 18 when a voltage is applied to the piezo-electric element 14 to cause a deformation of the piezo-electric element 14, and during such pivotal motion of the shutter blades 2 and 4, a pair of small holes 2A and 2B perforated in the shutter blade 2 for detection of a first specific position of the shutter blades 2 and 4 directly before the shutter starts to open its aperture and a second specific position at which a minimum shutter aperture opening is provided, respectively, are successively detected by a photo-coupler 10 including a light source and a light detecting element in order to detect movement of the shutter.

Figure 2:
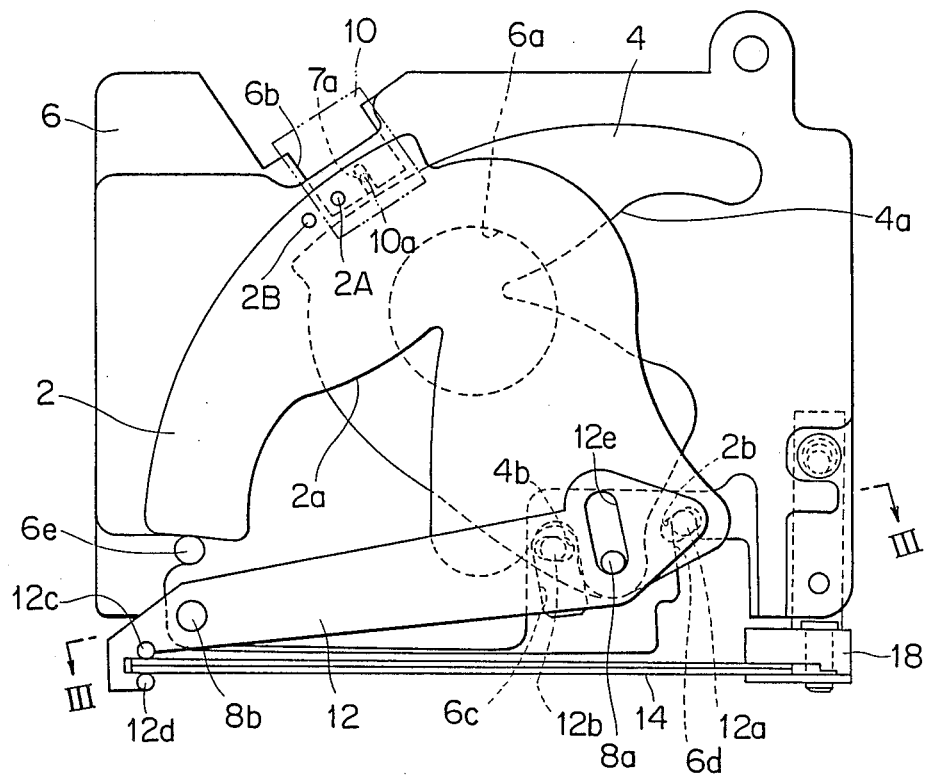
FIG. 2 is a plan view showing the entire shutter of FIG. 1.
Figure 3:
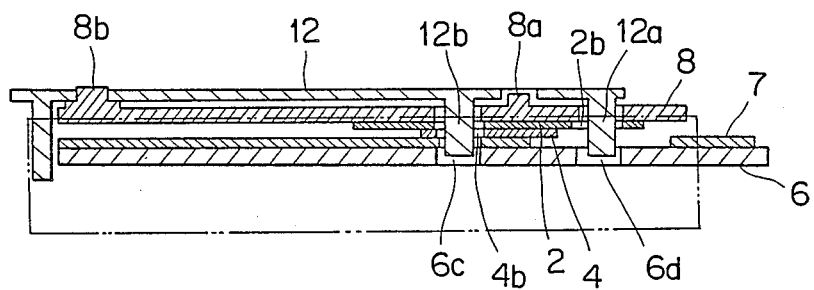
FIG. 3 is a cross sectional view taken along line III—III of FIG. 2.
Figure 4:
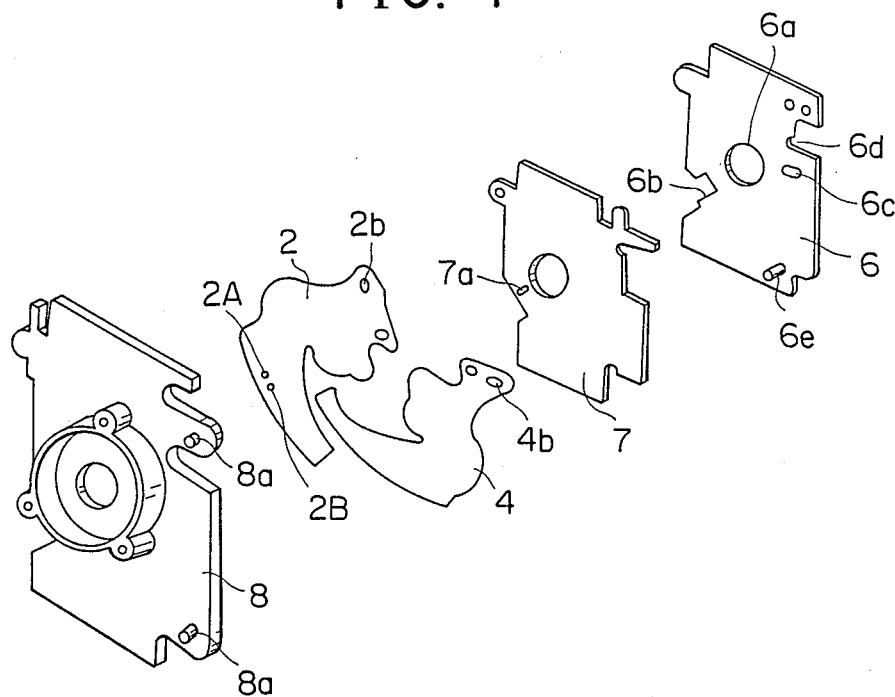
FIG. 4 is a fragmentary perspective view showing principal parts of the shutter of FIG. 1.

Now, construction and operation of the individual components will be described. It is to be noted, however, that most part of a shutter front plate 8 is omitted and only pivot shafts are shown in FIG. 2 in order to facilitate the understanding of the construction of the mechanism. Referring to FIGS. 2 to 4, the shutter blades 2 and 4 are supported for pivotal motion on a shaft 8a securely mounted on the shutter front plate 8 and have substantially symmetrical configurations with respect to a line interconnecting the center of an exposure aperture 6a perforated in a shutter base plate 6 and the center of the shaft 8a.

As seen in FIGS. 3 and 4, the shutter blades 2 and 4 are accommodated in a spacing formed between the shutter front plate 8 and an intermediate plate 7. The shutter blades 2 and 4 can be pivoted in the individual closing directions until one end of the shutter blade 2 is brought into contact with a pin 6e securely mounted on the shutter base plate 6. It is to be noted that pivotal motion of the shutter blades 2 and 4 in the closing directions may otherwise be limited by the shaft 8a which is contacted at an end face thereof with an inner periphery of an elongated hole 12e of an opening and closing lever 12.

Elongated holes 2b and 4b are formed in the shutter blades 2 and 4, respectively, and engaging pins 12a and 12b provided on the opening and closing lever 12 are engaged in the elongated holes 2b and 4b of the shutter blades 2 and 4, respectively. Thus, the shutter blades 2 and 4 are pivoted by movement of the engaging pins 12a and 12b in and along the elongated holes 2b and 4b, respectively. The shutter blades 2 and 4 have V-shaped cutaway openings 2a and 4b formed therein, respectively, so that as the shutter blades 2 and 4 are pivoted in the respective aperture closing directions around the common shaft 8a, the V-shaped cutaway openings 2a and 4a will open the exposure aperture 6a of the shutter base plate 6. The small holes 2A and 2B are provided on a same circumferential line of the shutter blade 2 around the shaft 8a. Thus, when the shutter blade 2 is pivoted, the small holes 2A and 2B are moved on the same circumferential line. An elongated hole 7a is formed at a position of the intermediate plate 7 on the same circumferential line, and the optical detecting element 10 is secured adjacent a further cutaway portion 6b of the shutter base plate 6. The small holes 2A and 2B of the shutter blade 2 are located such that, during pivotal motion of the shutter blade 2, the small hole 2A is first brought into register with the elongated hole 7a of the intermediate plate 7 at the first specific position described above or at a point of time directly before the shutter begins to open the aperture thereof at a measuring position 10a of the optical detecting element 10, and then the second small hole 2B is brought into register with the elongated hole 7a at the measuring position 10a of the optical detecting element 10 at a point of time when the blade 2 is pivoted to the second specific position at which the shutter provided a shutter aperture opening of a minimum diameter is provided. The small diameter 2A is provided to define a point of time at which measurement of an exposure time is to be started. The shutter base plate 6 has formed therein the exposure aperture 6a, the cutaway portion 6b in which the optical detecting element 10 is provided, and a pair of elongated holes 6c and 6d for preventing the pins 12a and 12b mounted on the opening and closing lever 12 from contacting with the shutter base plate 6 to interfere with pivotal motion of the shutter base plate 6. The opening and closing lever 12 is supported for pivotal motion around a shaft 8b mounted on the shutter front plate 8. The elongated hole 12e of the opening and closing lever 12 is formed at a portion adjacent a right-hand end in FIG. 2 thereof, and the shaft 8a on the shutter front plate 8 is fitted in the elongated hole 12e so that the shaft 8a may not interfere with the opening and closing lever 12. The pair of engaging pins 12a and 12b engaged in the elongated holes 2b and 4b of the shutter blades 2 and 4, respectively, are mounted at substantially symmetrical locations adjacent the right-hand end in FIG. 2 of the opening and closing lever 12 with respect to the elongated hole 12e of the opening and closing lever 12. A pair of pins 12c and 12d are mounted at the other end portion of the opening and closing lever 12, and a left end portion in FIG. 2 of the piezo-electric element 14 is received between the pins 12c and 12d. The piezo-electric element 14 is secured at the other end thereof to the holding plate 18.

Figure 1:
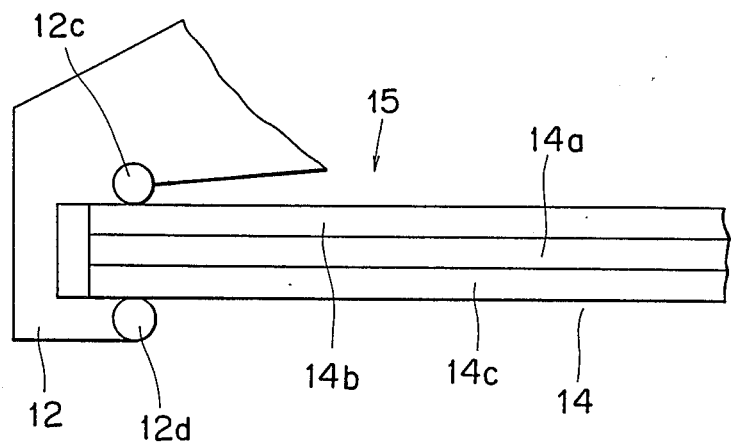
FIG. 1 is a plan view showing part of a shutter of a camera which employs a piezo-electric actuating device to which the present invention is applied.

Referring to FIG. 1, the piezo-electric element 14 includes two piezo-electric ceramics members 14b and 14c in the form of plates applied to each other with an electrode plate 14a interposed therebetween. Here, the piezo-electric ceramics members 14b and 14c are deformed or bent in the clockwise direction as indicated by an arrow mark 15 around the fulcrum provided by the fixed portion of the piezo-electric element 14 to the base plate 6 when a voltage is applied in individual predetermined directions, that is, in the opposite polarities, to the piezo-electric ceramics members 14b and 14c, but on the contrary when a voltage is applied in the individual reverse directions, the piezo-electric ceramics members 14b and 14c are deformed or bent in the counterclockwise direction opposite to the direction of the arrow mark 15. The piezo-electric ceramics plates 14b and 14c have a sufficient yield strength against deformation thereof by application of a voltage thereto in the individual predetermined directions and can thus withstand application of a voltage higher than 200 volts. To the contrary, the piezo-electric ceramics members 14b and 14c are low in yield strength against deformation thereof by application of a voltage thereto in the individual reverse directions and will thus yield readily by deformation thereof by application of a voltage of 50 volts or so.

It is to be noted that, in the following description, the forward direction denoted the direction of the arrow mark 15 or the direction of application of a voltage which causes deformation of the photoelectric element 14 in the direction of the arrow mark 15, and the reverse direction denotes a direction opposite to the forward direction.

Figure 5A:
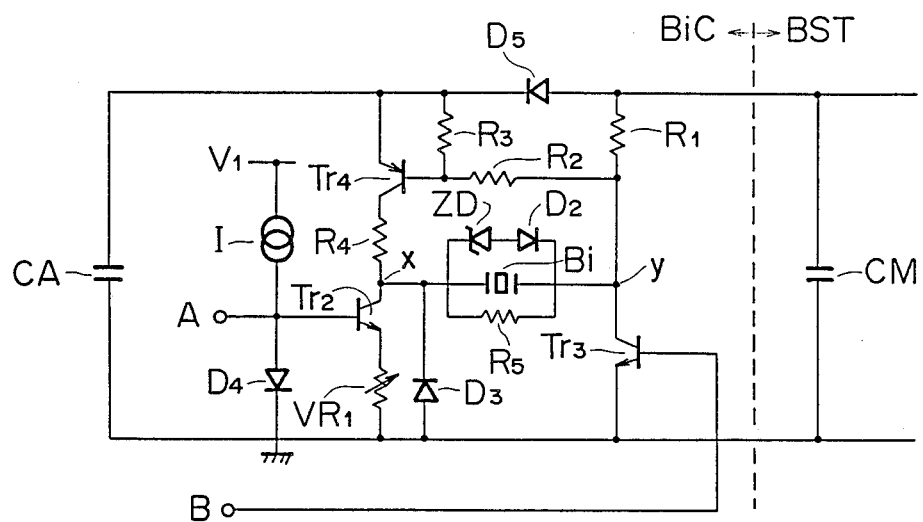
FIG. 5a is a circuit diagram showing a driving circuit for a shutter actuating mechanism in which a piezo-electric element is employed as a driving source.

Now, construction of a driving circuit for driving the piezo-electric shutter shown in FIGS. 1 to 4 will be described with reference to FIG. 5a. The circuit shown includes three transistors $Tr_2$, $Tr_3$ and $Tr_4$, a Zener diode ZD, three diodes $D_2$, $D_3$ and $D_4$, a piezo-electric element Bi corresponding to the piezo-electric element 14 of FIG. 2 for actuating the shutter, and a variable resistor $VR_1$ cooperating with a constant-current regulated power source I and the diode $D_4$ to make an adjustment so that a predetermined constant current flow may be supplied to the piezo-electric element Bi.

Figure 5B:
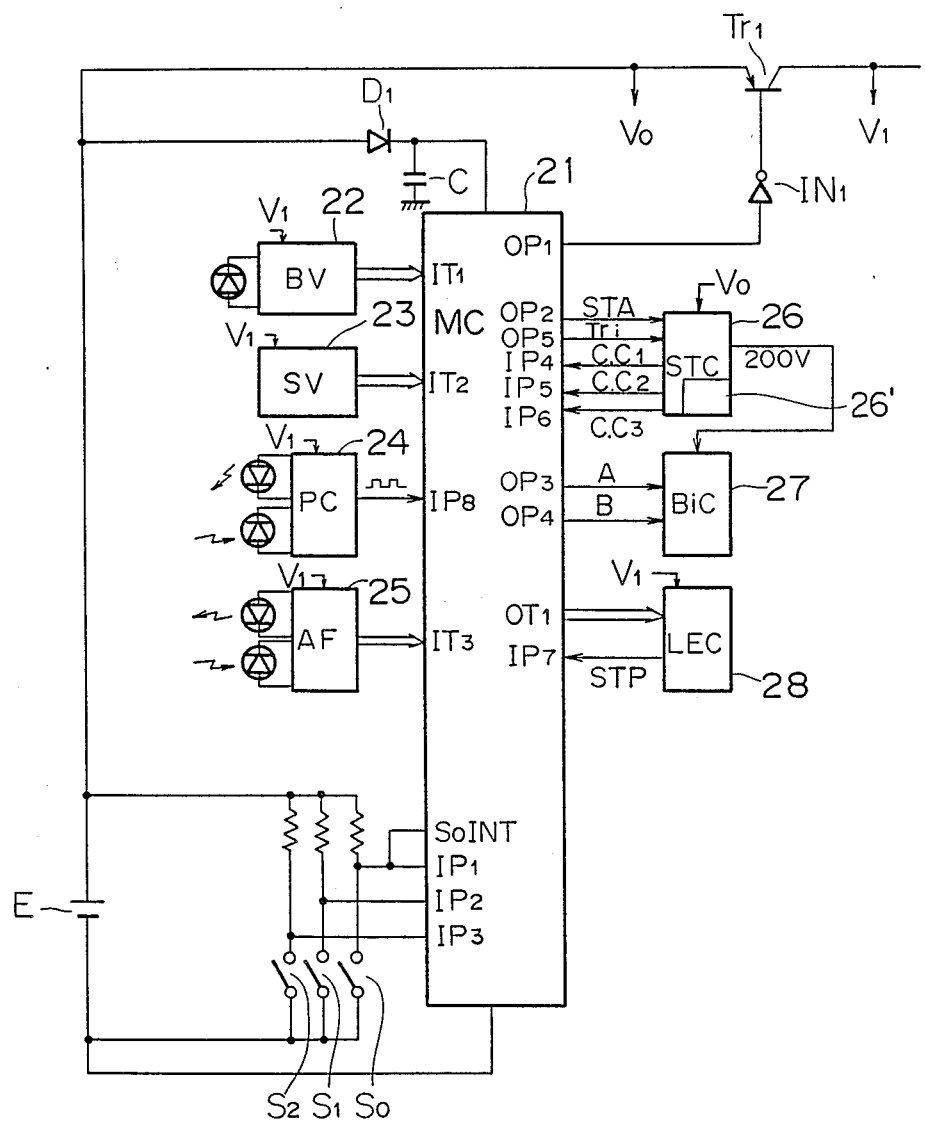
FIG. 5b is a block diagram showing a control circuit of the camera of FIG. 1.

The driving circuit further includes a main capacitor CM serving as a driving power source for the piezo-electric element Bi for accumulating therein a voltage fed from a dc-dc converter not shown which boosts a voltage from a battery E (refer to FIG. 5b). In FIG. 5b, the main capacitor CM is shown as included in a light emitting circuit 26 of an electronic flash device of the camera and thus serves as a common driving power source for the piezo-electric element Bi and a flash light emitting discharge tube not shown of the flash device. Accordingly, if the charge of the main capacitor CM is used for emission of flash light by the flash device, the voltage of the main capacitor CM may sometimes drop to a voltage lower than a specific voltage required to cause a closing motion of the piezo-electric shutter by the piezo-electric element Bi. Referring back to FIG. 5a, in order to assure accumulation of a reverse voltage of about 50 volts which is a little lower than a reverse voltage that may cause deformation of the piezo-electric element Bi by an amount greater than the yield strength, an auxiliary capacitor CA is additionally provided in the circuit of FIG. 5a. The auxiliary capacitor CA need not necessarily be provided, however, if, for example, a capacitor connected to be charged by the dc-dc converter exclusively for driving the piezo-electric element is provided separately from the capacitor for driving the flash light emitting discharge tube. The circuit shown in FIG. 5a further includes a reverse current preventing diode $D_5$ for preventing a charge of the auxiliary capacitor CA from flowing to the light emitting circuit 26 side.

Operation of the circuit when the piezo-electric element Bi is to be driven to open the shutter will now be described. When signals received at terminals A and B of the driving circuit, for example, from a microcomputer are both in a low voltage level, the transistors $Tr_2$ and $Tr_3$ are both brought into a cut off state, and the potentials at points x and y in FIG. 5a are equal to a potential at an upper terminal in FIG. 5a of the main capacitor CM to which power is supplied from the light emitting circuit 26.

In this condition, if a signal of a high voltage level is received at the terminal A from the microcomputer as an instruction signal for opening the shutter, the transistor $Tr_2$ is rendered conducting so that a capacitor component of the piezo-electric element Bi is charged by a constant current flow from the constant-current regulated power source I.

Consequently, the piezo-electric element Bi is deformed gradually in the direction of the arrow mark 15 in FIG. 1 to open the shutter blades 2 and 4. The values of resistors $R_2$ and $R_3$ are determined in accordance with a terminal voltage of another resistor $R_1$ which voltage is developed by a current flow through the resistor $R_1$ (charging current to the piezo-electric element Bi) so that the transistor $Tr_4$ may not rendered conducting during opening of the shutter blades 2 and 4. Further, since in this condition the potential at the point x is lower than the potential at the point y, the reverse current preventing diode $D_2$ is connected in series to the Zener diode ZD so that a current may not flow through the Zener diode ZD which is connected in parallel to the piezo-electric element Bi.

Subsequently, when a reverse voltage is to be applied to the piezo-electric element Bi to close the shutter, signals of the high level are received at the terminals A and B from the microcomputer so that the transistors $Tr_2$ and $Tr_3$ are both rendered conducting to lower the potential at a junction between the resistors $R_1$ and $R_2$ thereby to render the transistor $Tr_4$ conducting. Consequently, the potential at the point x becomes higher than the potential at the point y. Accordingly, the voltage between the points x and y which is applied across the piezo-electric element Bi has a reverse polarity to that when the shutter is to be opened, and therefore the shutter makes a closing operation. The voltage applied across the piezo-electric element Bi then is 50 volts near the limit voltage which causes a maximum allowable deformation of the piezo-electric element in the direction, and the Zener diode ZD is selected depending upon the voltage and connected in parallel to the piezo-electric element Bi. It is to be noted that even if the signal at the terminal A is at the low level then, a similar operation is performed. Meanwhile, the diode $D_3$ is provided to prevent the voltage at the point x from rising to a high negative voltage at an instant when the transistor $Tr_3$ is rendered conducting while the resistor $R_5$ is provided to prevent a voltage from being applied across the piezo-electric element Bi when there is a leak current flowing from the point x to the ground, thereby preventing the shutter from opening when the camera is inoperative.

Referring now to FIG. 5b, a control circuit of the camera to which the present invention is applied is shown in block diagram. The controlling circuit includes a microcomputer 21 which controls sequencing of the camera and calculates for exposure of the camera. The microcomputer 21 has a timer function incorporated therein.

The circuit further includes a light measuring circuit 22 for measuring a brightness of an object of photographing by means of a photosensitive element, for example, via a lens not shown provided in the camera independently of a photographing lens. The light measuring circuit 22 delivers a digital signal of the measured brightness data BV of the object to the microcomputer 21. A film sensitivity reading circuit 23 reads a sensitivity SV of a film and delivers a digital signal of the film sensitivity SV thus read to the microcomputer 21. A photo-coupler 24 detects a magnitude of opening of the shutter aperture and corresponds to the optical detecting element denoted at 10 in FIG. 2. The photo-coupler 24 delivers an electric pulse when each of the small holes 2A and 2B formed in the shutter blade 2 (FIG. 2) is brought to the measuring position 10 between the light source and the photosensitive element not shown of the photo-coupler 24 (10 in FIG. 2). A distance measuring circuit 25 measures a distance to an object and delivers a digital signal indicative of the measured distance to the microcomputer 21. A lens driving circuit 28 is provided to drive the photographing lens of the camera to move to a specific position for focusing in accordance with a lens moving amount calculated at the microcomputer 21 from information of the measured distance from the distance measuring circuit 25. When a power supply controlling transistor $Tr_1$ is conducting, power is supplied to the above mentioned elements 22 to 25 and 28 from the battery power source E via the transistor $Tr_1$ to allow operation of the elements 22 to 25 and 28.

The light emitting circuit 26 includes, as described hereinabove, the dc-dc converter for boosting a power source voltage of the battery E and the main capacitor connected to be charged by an output of the converter, and operates in response to a signal from the microcomputer 21 to cause the flash device to emit light with the charge accumulated in the capacitor. The charge accumulated in the capacitor is used to drive the piezo-electric element (Bi of FIG. 5a and 14 of FIG. 2) to open or close the shutter and also to set the shutter blades to their individual initial positions. In order to detect whether or not a voltage required for a selected one of objects of use is accumulated in the capacitor, up to three voltage detecting circuits not shown are provided for three different objects of use, including a first voltage detector for detecting a voltage of 250 volts required to drive the flash light emitting discharge tube to emit light, a second voltage detector for detecting a voltage of 50 volts which is required to close the shutter or set the shutter blades to their individual initial positions and is a little lower than the limit voltage which causes a maximum allowable deformation of the piezo-electric element in the reverse direction, and a third voltage detector for detecting a voltage of 200 volts required to cause the piezo-electric element to be deformed in the forward direction to open the shutter.

The circuit of FIG. 5b further includes a piezo-electric element driving circuit 27 for applying a voltage to the piezo-electric element to actuate the shutter. The piezo-electric element driving circuit 27 corresponds to the circuit as shown in and described with reference to FIG. 5a hereinabove or to a circuit having an equivalent function to that of the circuit of FIG. 5a.

The circuit of FIG. 5b further includes a reverse current preventing diode $D_1$, a backup capacitor C for backing up the supply of power to the microcomputer 21, and the aforementioned power supply controlling transistor $Tr_1$. Thus, the light emitting circuit 26 is supplied with power directly from the power source E while the piezo-electric element driving circuit 27 is supplied with power from the power supply controlling transistor $Tr_1$ and also with the piezo-electric element driving voltages of 200 volts and 50 volts described above from the light emitting circuit 26 as seen in FIG. 5b.

Various switches of the circuit of FIG. 5b will now be described. A main switch $S_0$ is connected to the microcomputer 21 and is turned on and off when, for example, a lens cover not shown is open and closed, respectively. A photographing preparing switch $S_1$ is turned on when a release button not shown is depressed to a first stroke or depth, and as the switch $S_1$ is turned on, the camera makes preparation for subsequent photographing, including measurement of a brightness of and a distance to an object. A release switch $S_2$ is turned on when the release button is depressed to a second stroke greater than the first stroke, and as the release switch $S_2$ is turned on, a photographing operation is carried out.

Now, exemplary operation of the camera to which the piezo-electric shutter of the embodiment described above is applied will be described with reference to flow charts shown in FIGS. 6 and 7. It is to be noted that the number of each of steps shown in the flow charts is indicated with a mark # added thereto.

If the main switch $S_0$ is turned on, a signal changing from an H level to an L level is received by a terminal $S_0INT$ of the microcomputer 21. Upon detection of the signal, the microcomputer 21 executes a program which is illustrated in the flow charts of FIGS. 6 and 7.

Figure 6:
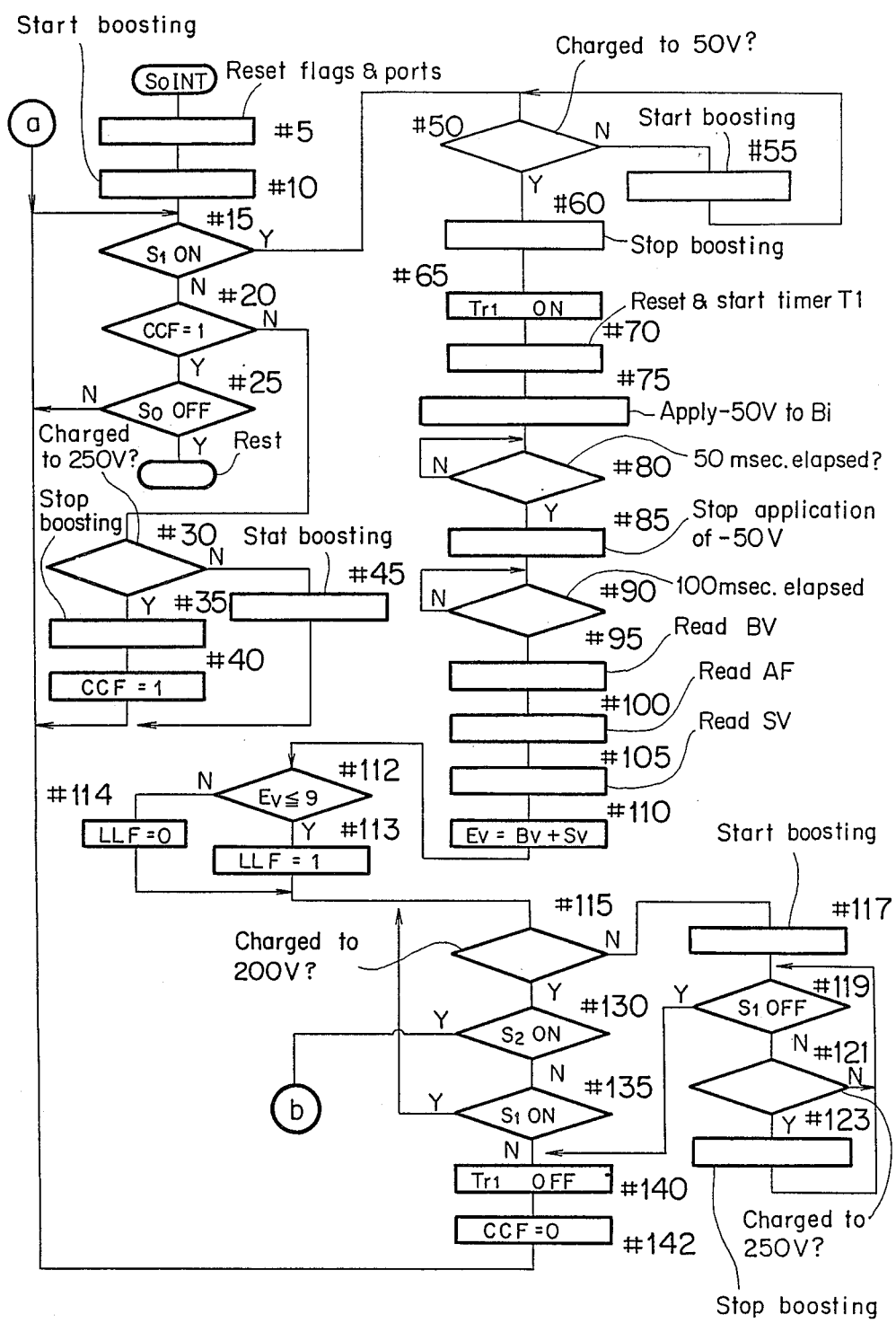
FIGS. 6 and 7 are flow charts of a routine illustrating a flow of operations of the camera of FIG. 1.

Referring first to FIG. 6, the microcomputer 21 at first resets flags and ports thereof in the set state at step #5, and then at step #10, it delivers from a terminal $OP_2$ thereof a boosting starting signal STA of the high (H) level to the light emitting circuit 26 having such a construction as described hereinabove so that the dc-dc converter of the light emitting circuit 26 starts its operation to charge the main capacitor. It is to be noted that the dc-dc converter stops its operation when the level of the boosting starting signal STA changes to the low (L) level.

Then at step #15, the microcomputer 21 checks a voltage level at a terminal $IP_2$ thereof to determine whether or not the photographing preparing switch $S_1$ is on, that is, whether or not the release button is depressed to the first position, and if the level is high, then the microcomputer 21 determines that the photographing preparing switch $S_1$ is off and advances the sequence to step #20. At step #20, the microcomputer 21 determines whether or not a flag CCF indicating whether or not the voltage across the main capacitor of the light emitting circuit 26 is equal to or higher than 250 volts, or in other words, whether or not the main capacitor has been charged up to 250 volts, is in the set state. If the capacitor has not yet been charged up and accordingly the flag CCF is not in the set state, the microcomputer 21 waits until the photographing preparing switch $S_1$ is turned on while continuing charging of the main capacitor until the first voltage detecting circuit for detecting the voltage of 250 volts detects that the voltage accumulated in the main capacitor exceeds 250 volts and delivers to the microcomputer 21 a signal of the high level indicative of completion of the charging in response to which signal the microcomputer 21 sets the flag CCF indicative of the completion of the charging (steps #30 to #45, #15 and #20).

As the flag CCF in the set state indicates that the capacitor has been already charged up, a level at a terminal $IP_1$ of the microcomputer 21 is then checked at step #25 to determine whether or not the main switch $S_0$ is off. If the main switch $S_0$ is off and accordingly high level is received at the terminal $IP_1$, this means that the photographing once started is suspended and accordingly the microcomputer 21 stops processing thereof. On the contrary, if the low level is received at the terminal $IP_1$ at step #25 and accordingly the main switch $S_0$ is on, the sequence returns from step #25 to step #15 so that the microcomputer 21 waits until the release button is subsequently depressed to the first stroke to turn the photographing preparing switch $S_1$ on.

By the sequence of operations described above, charging of the main capacitor is continuously performed when the main switch $S_0$ is on and the photographing preparing switch $S_1$ *is not on, for example, when a finger of an operator is removed from the release button.*

On the other hand, in case the release button is depressed so that the photographing preparing switch $S_1$ is turned on at #15, the sequence advances to step #50 at which an output of the second voltage detector for detecting that the voltage of the main capacitor of the light emitting circuit 26 is higher than 100 volts is checked to detect whether or not the charged voltage reaches the specific voltage sufficient to set the piezo-electric element of the piezo-electric shutter to its initial position. In case that the specific voltage is not yet reached and the output of the second voltage detector is at the low level, the microcomputer 21 delivers, at step #55, a signal STA of the high level to the light emitting circuit 26 in order to start or continue boosting. After then, the sequence returns to step #50 in order to wait until main capacitor is charged up to the voltage of 100 volts. Thus, in case it is detected at step #50 that the voltage of 100 volts is reached and accordingly the signal from the second voltage detector is at the high level the signal STA is changed at step #60, into the low level to stop boosting. It is to be noted that, although the second voltage detector may otherwise deliver a detection output at the voltage of 50 volts at which the shutter is closed and set to its initial position by the piezo-electric element as described hereinabove, the voltage of 100 volts is employed as a reference voltage for detection including a sufficient allowance because there is the possibility that the main capacitor may discharge so that the voltage thereof may become lower than 50 volts as time passes.

Subsequently at step #65, the microcomputer 21 changes the level of a terminal $OP_1$ thereof into the "H" level to render the power supply transistor $Tr_1$ conducting to start the supply of power to several circuits connected to the same including the light measuring circuit 22 and the distance measuring circuit 25 to start operation of the circuits 22 and 25. Then at step #70, the microcomputer 21 resets and starts operation of an internal timer $T_1$ thereof. The timer $T_1$ provides a voltage application time during which a reverse voltage is to be applied to the piezo-electric element Bi for actuating the shutter blades in order to set the piezo-electric element Bi to its initial position. Then at step #75, the microcomputer 21 delivers signals of the high level from terminals $OP_3$ and $OP_4$ thereof to the terminals A and B of the driving circuit 27 to cause the driving circuit 27 to apply a voltage of $-50$ volts across the piezo-electric element Bi as described hereinabove. Such application of the negative voltage continues at step #80 until the timer $T_1$ measures a period of time of 50 msec., and after measurement of 50 msec., the microcomputer 21 changes, at step #85, the level of the terminals $OP_3$ and $OP_4$ thereof into the low level to step the application of the reverse voltage of 50 volts.

Figure 8:
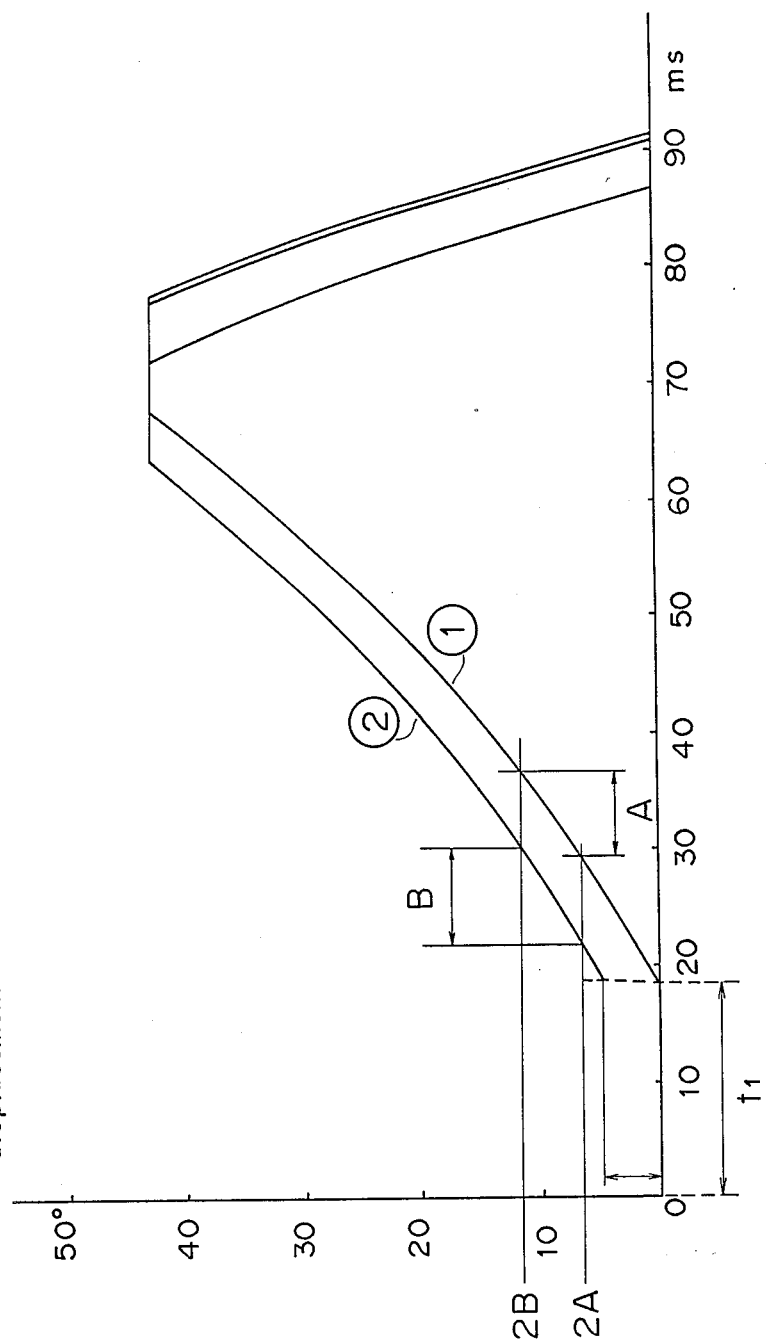
FIG. 8 is a graph illustrating characteristics of opening of a shutter in which a piezo-electric element is used.

The reason why in the present embodiment the exposure error can be removed by setting the piezo-electric element to its home position, that is, its proper initial position as described hereinabove will be described with reference to FIG. 8 which illustrates exemplary characteristics of opening of a shutter serving also s an aperture diaphragm with respect to a time of application of a voltage to the piezo-electric element. In FIG. 8, the axis of abscissa indicates a time of voltage application, and the axis of ordinate indicates opening of the shutter blades represented in angular displacement. However, since the charging time and the terminal voltage of the piezo-electric element increase in proportion to each other where the piezo-electric element is charged with a constant current flow, the axis of abscissa may be regarded as the terminal voltage of the piezo-electric element.

In FIG. 8, a curve 1 indicates an opening characteristic of the shutter which is actuated by the piezo-electric element when the piezo-electric element is actuated or started from a predetermined home position or correct initial position (0 degree in displacement), and a curve 2 indicates another opening characteristic of the shutter when the piezo-electric element is actuated or started from a position displacement from the predetermined home position (5 degrees in displacement). During a period of time from 0 to 20 msec. denoted at $t_1$ in FIG. 8, a controlled voltage is applied a drive the piezo-electric element, but the shutter does not move because of a force of statical friction of the shutter blades. After the time $t_1$ has elapsed, the piezo-electric element starts its deformation, and as time passes, the piezo-electric element is deformed upwardly in FIG. 2 in response to the application time (terminal voltage of the piezo-electric element) so that the shutter blades 2 and 4 are actuated by the piezo-electric element and present such an opening amount as seen in FIG. 8. In this instance, however, the amount of displacement of the shutter blades is irrespective of at which position the piezo-electric element is initially positioned, and as the time of voltage application to the piezo-electric element increases, the shutter blades are gradually accelerated as seen at the curves 1 and 2. Thus, the two curves 1 and 2 exhibit substantially similar characteristic to each other as seen in FIG. 8.

By the way, in FIG. 8, two lines 2A and 2B are indicated in parallel to the axis of abscissa at positions of about 7 and 12 degrees of the displacement of the shutter blade. The line 2A indicates a position at which the small hole 2A formed in the shutter blade 2 of FIG. 2 is detected by the photocoupler 10, that is, an angular displacement directly before the shutter blades start to open the shutter aperture while the line 2B is similarly indicates a position at which the small hole 2B formed in the shutter blade 2 is detected by the photo-coupler 10, that is, an angular displacement at which the shutter blades provide a predetermined minimum aperture.

Now, examination is made here of a case wherein the appropriate exposure value is a minimum aperture diameter. In FIG. 8, reference symbol A denotes an interval of time required to move the shutter blades from the first specific positions directly before they start to open the shutter aperture, that is, from starting of measurement of the exposure time, to the second specific positions at which they present an opening of a minimum diameter when the initial position of the piezo-electric element is correct and coincides with the home position, and reference symbol B denotes an interval of time required to move the shutter blades from the first specific positions to the second specific positions when the initial position of the piezo-electric element is displaced from the home or correct initial position.

Because opening of the shutter progressively increases as the time of voltage application to the piezo-electric element passes, that is, increases in proportion to the terminal voltage of the piezo-electric element, the time B from the line 2A to the other line 2B at which the minimum opening diameter is reached where the initial position of the piezo-electric element is displaced from the home position and incorrect becomes longer at an early stage after application of the voltage than the time A similarly from the line 2A to the line 2B where the initial position of the piezo-electric element is correct.

Accordingly, the shutter speed (or opening time) varies depending upon from which position the piezo-electric element and hence the shutter blades are actuated, and such variation of the shutter speed will result in error in exposure. In the present embodiment, since the exposure in controlled by the opening time of the piezo-electric shutter, the opening time will vary for an exposure value when the appropriate exposure is provided by an opening of the minimum diameter. Further, where exposure with an opening of a greater diameter than the diameter of the minimum opening is appropriate, the diameter of an opening varies depending upon an initial position of the piezo-electric element, which will also make an error in exposure. In this manner, if a driving voltage is applied to the piezo-electric element when the piezo-electric element suffers from deformation by a residual charge and is not set to the correct initial position, this will result in error in exposure. Therefore, in order to prevent this, in the present embodiment, the reverse voltage is applied to the piezo-electric element to deform the piezo-electric element in the reverse direction to that in actuation of the piezo-electric element until the piezo-electric element is set to its home position which is determined in accordance with the construction of the shutter, and after then, the piezo-electric element is driven in the reverse direction to open the shutter.

Referring back to the flow chart of FIG. 6, the microcomputer 21 waits at step #90 until the timer $T_1$ measures a time of 100 msec. after resetting and starting thereof at step #70 in order to wait until a light measuring operation and a distance measuring operation are completed by the light measuring circuit 22 and the distance measuring circuit 25, respectively. After lapse of the time of 100 msec., the microcomputer 21 reads, successively at steps #95, #100 and #105, a measured brightness value BV, a measured distance value AF and a film sensitivity SV from the light measuring circuit 22, the distance measuring circuit 25 and the film sensitivity reading circuit 23, respectively, and then calculates, at step #110, an exposure value EV from the measured brightness value BV and the film sensitivity SV.

Then at step #112, the exposure value EV is discriminated whether it is equal to or smaller than "9", and if it is equal to or smaller than "9", then a flag LLF indicating a low brightness condition is set to "1" at step #113, but on the contrary if the exposure value EV is greater than "9", the flag LLF is reset to "0" at step #114.

Subsequently at step #115, the microcomputer 21 checks a level at a terminal $IP_6$ thereof to which an output of the third voltage detector within the light emitting circuit 26 is coupled to detect whether or not the main capacitor is charged to a voltage of 200 volts required for the piezo-electric element to actuate the shutter to open, and if the terminal $IP_6$ is at the high level which indicates that the main capacitor is charged up to 200 volts, the microcomputer 21 determines that the camera is ready for releasing of the shutter, and then checks, at step #130, a level at a terminal $IP_3$ thereof to detect whether or not the release switch $S_2$ for starting photographing is on. Here, if the release switch $S_2$ is on to start photographing and consequently the input terminal $IP_3$ is at the low level, then the microcomputer 21 executes a sequence of release controlling steps beginning with step #145 shown is FIG. 7.

To the contrary, if the release switch $S_2$ is not on at step #130 and hence the terminal $IP_3$ is at the high level, then the microcomputer 21 detects at step #135 whether or not the photographing preparing switch $S_1$ is on. In case the switch $S_1$ is on and hence the terminal $IP_2$ of the microcomputer 21 is at the low level, the sequence returns to step #115 in order to watch the voltage of the 200 volt power supply and to wait subsequent depression of the release button. But on the contrary in case the switch $S_1$ is off and hence the terminal $IP_2$ is at the high level at step #135, the microcomputer 21 determines that the photographer has stopped the photographing operation and thus delivers, at step #140, a signal of the low level from the terminal $OP_1$ thereof to cut off the power supply transistor $Tr_1$ to stop the power supply to the light measuring circuit 22 and so on. Subsequently at step #142, the microcomputer 21 resets the flag CCF indicating that the terminal voltage of the main capacitor reaches 250 volts, and then returns the sequence to step #15 in order to effect charging of the main capacitor once again.

On the other hand, if it is determined at step #115 that the main capacitor is not yet charged up to a voltage equal to or higher than 200 volts, a signal STA of the high level is transmitted, at step #117, to the light emitting circuit 26 to start boosting, and then at light #119, a state of the photographing preparing switch $S_1$ is checked to determine whether or not it has been turned off. In case the switch $S_1$ is off and hence the terminal $IP_2$ is at the high level, the microcomputer 21 determines, at step 119, that the photographing operation is to be stopped, and thus advances the sequence to step #140. On the contrary, if the photographing preparing switch $S_1$ is on and hence the terminal $IP_2$ is at the low level at step #119, the level at the input terminal $IP_6$ is checked, at step #121, to determine whether or not the terminal voltage of the main capacitor is charged up to a voltage equal to or higher than 250 volts and hence the terminal $IP_6$ is at the high level, then the signal STA is changed, at step #123, into the low level to stop boosting whereafter the sequence returns to step #119. On the other hand, if the main capacitor is not yet charged up to 250 volts at step #121 and hence the terminal $IP_6$ is at the low level, the sequence skips step #123 and returns to step #119 to continue charging of the main capacitor. The steps 119, 121 and 123 thus constitute a loop for performing interruption of the release of the shutter when the terminal voltage of the main capacitor does not reach the voltage of 200 volts required for driving the piezo-electric element to regularly operate the shutter.

In case the release switch $S_2$ is on at step #130, the microcomputer 21 receives a signal of the low level at the input terminal $IP_3$ thereof. Consequently, the microcomputer 21 advances the sequence to a step #145 (FIG. 7) of a process for performing the release of the shutter.

Figure 7:
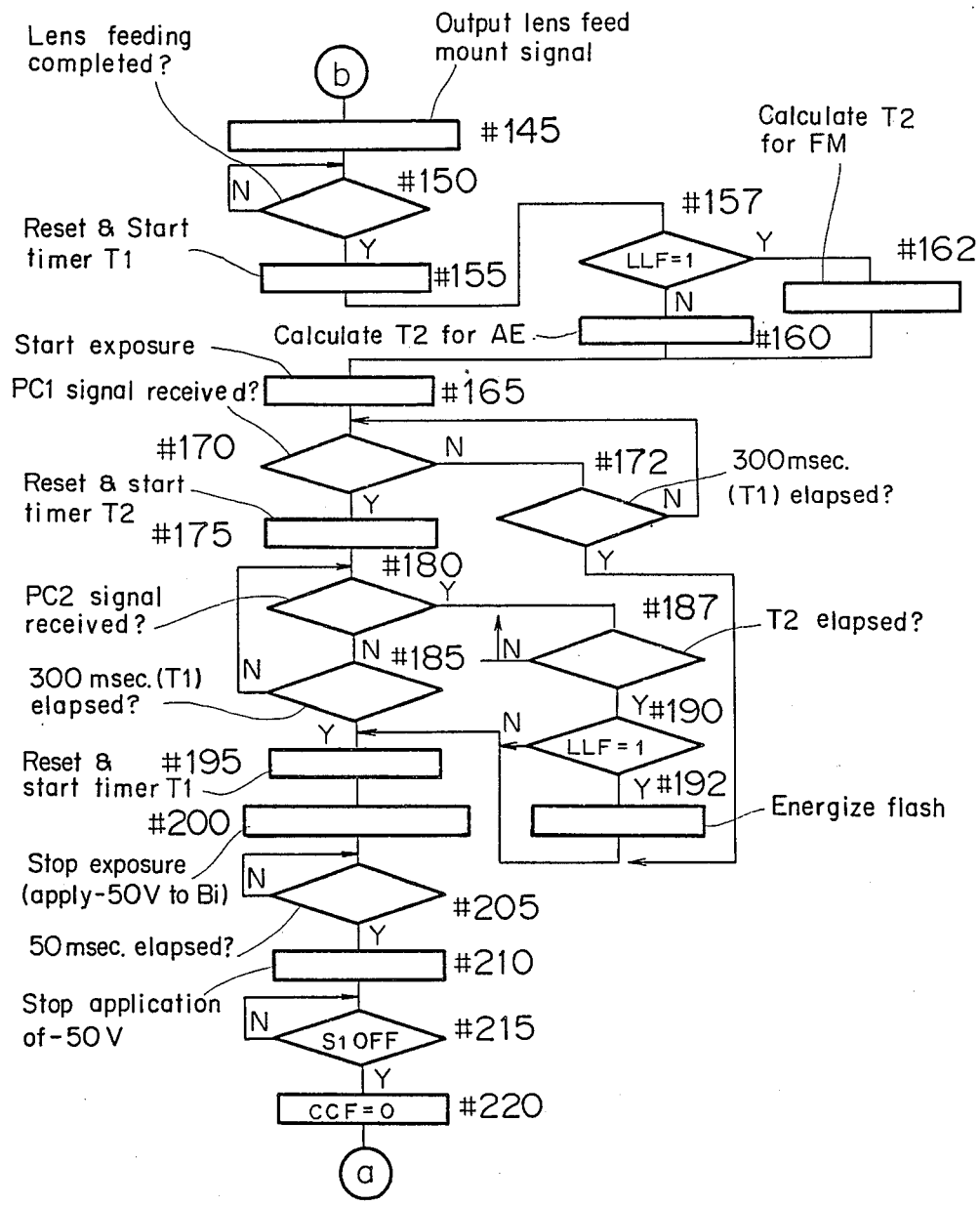

Referring now to FIG. 7, at step #145, the microcomputer 21 delivers a lens feed amount signal to the lens driving circuit 28. The lens feed amount signal includes information of an amount over which the lens of the camera is to be fed or moved in a direction of the optical axis thereof, and a lens feed starting signal. In response to the lens feed mount signal, the lens driving circuit 28 feeds the lens by such a specified amount or distance, and then when such feeding of the lens is completed, the lens driving circuit 28 delivers a stopping signal STP of the high level to a terminal $IP_7$ of the microcomputer 21. Upon reception of the stopping signal STP at step #150, the microcomputer 21 resets and starts operation of the timer $T_1$ at step #155. Here, the timer $T_1$ starts its measurement of time when a signal indicating that the shutter blades 2 and 4 are positioned at the first specific position or the second specific position or minimum opening providing position is not received from the photo-coupler 10 (FIG. 2) because, for example, the shutter does not execute a predetermined operation or by some other causes such as a trouble of the photo-coupler 10, and the timer $T_1$ is used to measure a time in order to prevent an operation in error of the camera when the cause is not eliminated within a predetermined period of time.

Subsequently, at step #157, the microcomputer 21 discriminates whether or not the flag LLF which indicates that the brightness of an object is so low that emission of light by the flash device is necessitated is in the set state, and if the flag LLF is in the set state, the microcomputer 21 calculates, at step #162, a shutter opening time $T_2$ corresponding to a diameter of a shutter opening which provides appropriate exposure for flash photographing from the distance measuring circuit 25 (FIG. 5b). On the contrary, if the flag LLF is not in the set state at step #157, the microcomputer 21 calculates, at step #160, an exposure time $T_2$ corresponding to a diameter of a shutter opening which provides appropriate exposure from the exposure value EV measured by the light measuring circuit 22. After completion of the calculation of an exposure time at step #162 or #160, the microcomputer 21 changes, at step #165, the level of the terminal $OP_3$ thereof into the high level to cause the voltage from the main capacitor to be applied to the piezo-electric element via the piezo-electric element driving circuit 27 shown in FIG. 5a to start an opening movement of the shutter blades.

After starting of the movement of the shutter, the microcomputer 21 waits, at step #172, for a time of 300 msec. measured at the timer $T_1$ until a first position signal indicating the first specific position of the shutter blades just before exposure is started, that is, a rising edge of a signal, is received at step #170 at a terminal $IP_8$ of the microcomputer 21 from the photo coupler 24 when the small hole 2A formed in the shutter blade 2 passes the photo-coupler 10 just before exposure is started. If a first position signal is received within the time of 300 msec., the microcomputer 21 resets and starts operation of the timer $T_2$ for measuring the exposure time at step #175, and then if a second position signal indicating the second specific position of the shutter blades is received at step #180, a shutter closing operation is performed at step #195 after a regular photographing operation of steps #187, #190 and #192. To the contrary, in case no first position signal is received within the time of 300 msec. at step #172, the sequence advances to a shutter closing controlling step #195 in order to execute resetting processing as error processing (steps #170 and #172).

Subsequently, the microcomputer 21 waits, at step #185 for 300 msec. as measured at the timer $T_1$ after starting of the timer $T_1$ until it receives, at step #180, a second rising edge of the output of the photo coupler 10 which is produced when the small hole 2B formed in the shutter blade 2 passes the photo-coupler 10 at the second specific or minimum opening providing position of the shutter blades 2 and 4. In case a second position signal indicating a minimum shutter opening is not received from the photo-coupler 24 within the time of 300 msec., the microcomputer 21 determines that no second position signal indicating a minimum shutter opening is received from the photo-coupler 24 by some reasons and thus advances the sequence to step #195. At step #195, the microcomputer 21 resets and starts operation of the timer $T_1$ for measuring an application time of a reverse voltage which is to be subsequently applied to the piezo-electric element to close the shutter.

Subsequently at step #200, a voltage of $-50$ volts for ending the exposure operation is applied from the piezo-electric element driving circuit 27 to the piezo-electric element to control closing of the shutter.

In summary, the timer $T_1$ is reset and started at step #155 before the shutter opening voltage is applied to the piezo-electric element at step #165. Then, in case the microcomputer 21 does not receive a signal indicating that the shutter blades are positioned directly before they start to provide an opening (steps #170, #172 and #195) or a minimum opening providing position signal (steps #180, #185 and #195) before the time of 300 msec. elapses after starting of the timer $T_1$, the regular photographing operation of the steps #187, #190 and #192 is not performed, and when the time of 300 msec. is measured at the extraordinary condition detecting timer $T_1$ (steps #172 and #185), the shutter closing voltage is applied to the piezo-electric element to close the shutter.

The reason will now be described. Since according to the present embodiment the piezo-electric element is employed as a driving source for the shutter, if the initial position of the piezo-electric element is not stabilized as described hereinabove, the opening speed of the shutter is not stabilized, and the shutter may not be opened at all within the appropriate exposure time $T_2$ or may be opened or not opened after lapse of the appropriate exposure time $T_2$. Also when there is such an extraordinary condition, the microcomputer 21 waits for opening of the shutter without producing a shutter closing signal until the timer $T_1$ measures 300 msec. Therefore, even if the shutter operates late, an exposure operation is performed with maximum possibility.

With the construction described just above, even if a signal indicating that the shutter blades are positioned at the first specific position directly before provision of a shutter opening or at the second specific or minimum opening providing position is not received from the photo-coupler while the shutter is operating regularly because the photo-coupler has some trouble, some photographing is performed with exposure for a time of 300 msec. at any rate.

It is to be noted that the unstable opening speed of the shutter may be caused, in addition to the reason described above, by a dispersion in characteristic of piezo-electric elements themselves (relation between the voltage and the opening characteristic) or by a dispersion in driving force required for opening the shutter which dispersion is caused by a difference in temperature or posture, and any shutter wherein the opening speed is not stable in this manner can be controlled in a similar manner.

In case a regular operation is proceeding, a signal indicating a minimum opening of the shutter is received, at step #180, from the photo-coupler 24 before the time of 300 msec. is measured by the extraordinary condition detecting timer $T_1$. Accordingly, the microcomputer 21 waits, at step #187, until the exposure time $T_2$ elapses after re-starting of the timer $T_2$, and after lapse of the exposure time $T_2$, the microcomputer 21 checks, at step #190, the flag LLF which indicates that the brightness of the object is too low. In case the flag LLF is in the set state at step #190, a pulse signal Tri instructing the flash device of emission of light is delivered, at step #192, from a terminal $OP_5$ of the microcomputer 21 to cause the flash device to emit light. After then, the microcomputer 21 advances the sequence to the shutter closing controlling step #195. To the contrary, when the flag LLF is not in the set state at step #190, the microcomputer 21 advances the sequence to the shutter closing controlling step #195 without causing the flash device to emit light.

At the shutter closing controlling step #195, the microcomputer 21 resets and starts operation of the timer $T_1$, and then at step #200, the microcomputer 21 changes the level of the terminal $OP_4$ thereof to the high level in order to apply a voltage of a reverse polarity to that for opening of the shutter to the piezo-electric element to close the shutter. Then, when the time of 50 msec. is measured at the timer $T_1$ at step #205, the microcomputer 21 changes, at step #210, the levels of the terminals $OP_3$ and $OP_4$ into the low level to stop application of the reverse voltage to the piezo-electric element. After then, at step #215, the microcomputer 21 waits until the photographing preparing switch $S_1$ is turned off to change the level of the terminal $IP_2$ to the high level, and then after the level of the terminal $IP_2$ is changed to the high level, the charging completion flag CCF is reset to zero at step #220, whereafter the sequence returns to step #15 in order to charge up the main capacitor of the light emitting circuit after completion of preceding photographing to prepare for subsequent photographing.

Figure 9:
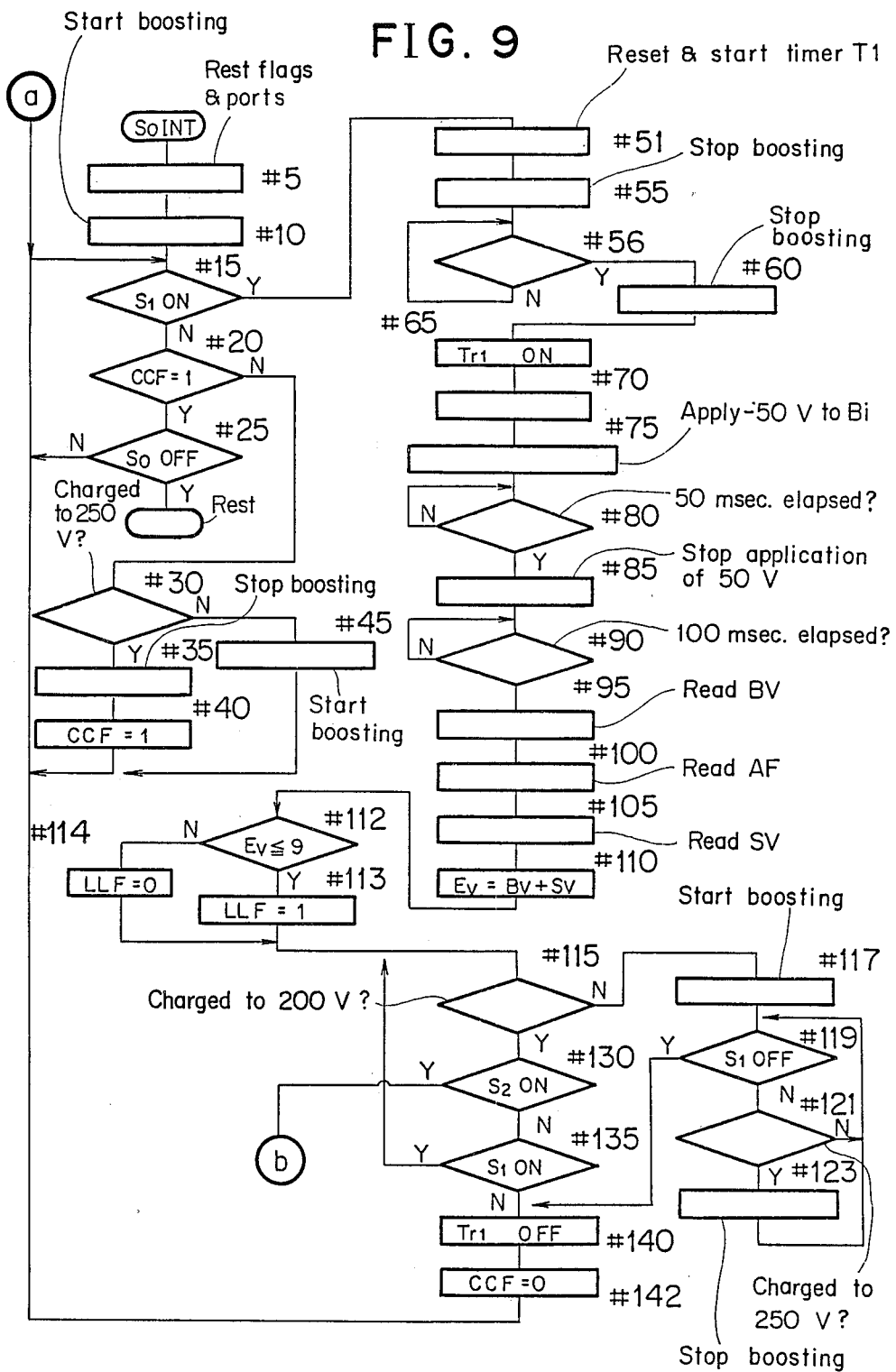
FIG. 9 is a flow chart of a modified routine corresponding to FIG. 6.

While in the embodiment shown in the flow chart described above the power source for setting the piezo-electric element to its initial position directly after the photographing preparing switch $S_1$ is turned on is charged to the predetermined voltage of 100 volts, the voltage for setting the piezo-electric element to its initial position is 50 volts near the limit voltage in the reverse direction. Accordingly, charging of the power source may be changed such that it may be boosted only for a present period of time. In this instance, the steps #50, #55 and #60 of FIG. 6 may be replaced by steps #51, #55, and #60 of FIG. 9. In particular, referring to FIG. 9, after the photographing preparing switch $S_1$ is turned on at step #15, the timer $T_1$ is started at step #51, and then boosting is performed for a predetermined period of time of 50 msec. on the timer $T_1$ at steps #55 and #56. After completion of the boosting of the predetermined period of time, the boosting is ended at step #60.

An alternative modification is also possible wherein no boosting operation is performed just after the photographing preparing switch $S_1$ has been turned on at step #15. In this modification, the steps #50 and #55 should be omitted. In this instance, even if a reverse voltage is applied to the piezo-electric element when the main capacitor is not yet charged to the voltage of 100 volts for setting the piezo-electric element to its initial position, the piezo-electric element may not be set to its home position. In such a case, however, it is detected at step #115 that the main capacitor is not yet charged sufficiently, and hence the release of the shutter is interrupted to prevent a photographing operation. Accordingly, photographing with inappropriate exposure can be prevented.

Further, while in the present embodiment a measured brightness value is stored once into a memory and such a stored brightness value is recalled later when an exposure value is to be determined, such a brightness value may otherwise be measured while an exposure operation is proceeding, and such measurement of brightness is preferably performed just when a first signal is received from the photo-coupler.

Having now fully described the invention, it will be apparent to one of ordinary skill in the art that many changes and modifications can be made thereto without departing from the spirit and scope of the invention as set forth herein.

What is claimed is:

1. A piezo-electric actuating device, comprising:

a piezo-electric element including a first piezo-electric member which is contracted when a first voltage of a first polarity is applied thereacross and which is elongated when a second voltage of a second polarity opposite to the first polarity is applied thereacross, and piezo-electric element further including a second piezo-electric member which is contracted when the second voltage is applied thereacross and which is elongated when the first voltage is applied thereacross, said piezo-electric member being deformed by application of the first and second voltage thereto;

a voltage applying means for alternatively applying the first and second voltages to said piezo-electric element; and a driven member connected to be actuated by said piezo-electric element upon deformation of said piezo-electric element such that when the first voltage is applied to said piezo-electric element, said driven member is moved in a first direction, and when the second voltage is applied to said piezo-electric element, said driven member is moved in a second direction opposite to the first direction;

said first and second piezo-electric members having a higher yield strength against deformation thereof by application of the first voltage than by application of the second voltage.

2. A piezo-electric actuating device as claimed in claim 1, wherein said driven member is a shutter which is used in a camera, whereby said shutter is opened upon application of the first voltage to said piezo-electric element and closed upon application of the second voltage to said piezo-electric element.

3. A piezo-electric actuating device as claimed in claim 2, wherein said piezo-electric element further includes a flexible electrode plate made of a conductive material and having said first and second piezo-electric members applied to opposite faces thereof, and said voltage applying means is connected to apply the first or second voltage between said electrode plate and the opposite faces of said first and second piezo-electric members remote from said electrode plate.

* * * * *